United States Patent
Tashiro

(10) Patent No.: US 11,923,125 B2
(45) Date of Patent: Mar. 5, 2024

(54) POWER CONVERSION DEVICE, MULTILAYER BOARD INCLUDED IN THE SAME, AND VEHICLE HAVING POWER CONVERSION DEVICE MOUNTED THEREIN

(71) Applicant: SUMITOMO ELECTRIC INDUSTRIES, LTD., Osaka (JP)

(72) Inventor: Keiji Tashiro, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 380 days.

(21) Appl. No.: 17/297,395

(22) PCT Filed: Oct. 11, 2019

(86) PCT No.: PCT/JP2019/040232
§ 371 (c)(1),
(2) Date: May 26, 2021

(87) PCT Pub. No.: WO2020/129376
PCT Pub. Date: Jun. 25, 2020

(65) Prior Publication Data
US 2022/0037074 A1 Feb. 3, 2022

(30) Foreign Application Priority Data
Dec. 21, 2018 (JP) .................. 2018-239268

(51) Int. Cl.
*H05K 1/02* (2006.01)
*H01F 27/24* (2006.01)
(Continued)

(52) U.S. Cl.
CPC .... *H01F 27/2804* (2013.01); *H02M 3/33573* (2021.05); *H02M 3/33576* (2013.01);
(Continued)

(58) Field of Classification Search
CPC ............ H05K 1/02; H05K 1/18; H05K 1/141; H05K 1/144; H05K 1/165; H05K 7/2039;
(Continued)

(56) References Cited

U.S. PATENT DOCUMENTS

| 5,952,909 A | 9/1999 | Umeno et al. |
| 2010/0007358 A1* | 1/2010 | Schaerrer ............... G01R 15/14 336/200 |

(Continued)

FOREIGN PATENT DOCUMENTS

| JP | H08-69935 A | 3/1996 |
| JP | 2010-093174 A | 4/2010 |

(Continued)

OTHER PUBLICATIONS

Nov. 19, 2019 Search Report issued in International Patent Application No. PCT/JP2019/040232.

*Primary Examiner* — Xiaoliang Chen
(74) *Attorney, Agent, or Firm* — Oliff PLC

(57) ABSTRACT

A power conversion device includes a multilayer board including conductive layers that form a primary-side coil and a secondary-side coil of a transformer; and a circuit board electrically connected to the multilayer board, having a first conversion circuit formed therein or thereon. The multilayer board includes a transformer region in which the transformer is formed; a core member disposed in the transformer region and around the primary-side coil and secondary-side coil are wound; a circuit formed region which is adjacent to the transformer region and a second conversion circuit is formed, the second conversion circuit being electrically connected to the primary-side coil or the secondary-side coil; and a terminal portion which is electrically connected to the secondary-side coil or the primary-side coil. The first conversion circuit is electrically con- (Continued)

nected to the transformer via the terminal portion. One of the coils has a smaller number of turns than the other coil.

7 Claims, 13 Drawing Sheets

(51) Int. Cl.
| | | |
|---|---|---|
| *H01F 27/28* | (2006.01) | |
| *H02M 3/335* | (2006.01) | |
| *H02M 7/48* | (2007.01) | |
| *H02M 7/797* | (2006.01) | |
| *H05K 1/14* | (2006.01) | |
| *H05K 1/16* | (2006.01) | |
| *H05K 1/18* | (2006.01) | |
| *B60L 50/60* | (2019.01) | |
| *H01R 12/52* | (2011.01) | |
| *H01R 12/58* | (2011.01) | |

(52) U.S. Cl.
CPC .............. *H05K 1/144* (2013.01); *H05K 1/165* (2013.01); *B60L 50/60* (2019.02); *B60L 2210/10* (2013.01); *H01F 27/24* (2013.01); *H01F 2027/2809* (2013.01); *H01R 12/52* (2013.01); *H01R 12/58* (2013.01); *H05K 1/18* (2013.01); *H05K 2201/09063* (2013.01); *H05K 2201/10166* (2013.01)

(58) Field of Classification Search
CPC .......... H05K 2201/09063; H05K 2201/10166; H01F 27/24; H01F 27/292; H01F 27/2804; H01F 27/2895; H01M 3/06; H01M 3/3374; H01M 3/33523; H01M 3/33553; H01M 3/33573; H01M 3/33576; H01M 3/53871; H02M 7/003; H02M 7/48; H02M 7/797; H02M 7/4807; H02M 7/53871

USPC ...... 361/765, 784; 363/17, 21.04, 21.06, 37, 363/141; 324/649; 336/200
See application file for complete search history.

(56) References Cited

U.S. PATENT DOCUMENTS

| | | | | |
|---|---|---|---|---|
| 2012/0250359 | A1* | 10/2012 | Knill | H02J 3/381 363/17 |
| 2012/0250372 | A1* | 10/2012 | Knill | H02M 7/53871 363/37 |
| 2012/0250373 | A1* | 10/2012 | Adam | H02J 3/381 363/37 |
| 2012/0250374 | A1* | 10/2012 | Knill | H02M 3/3374 363/37 |
| 2014/0009981 | A1* | 1/2014 | Charles Knill | H02M 7/4807 363/37 |
| 2015/0131353 | A1* | 5/2015 | Nakajima | H05K 7/2039 363/141 |
| 2016/0111965 | A1* | 4/2016 | Wang | H01F 41/041 363/21.04 |
| 2016/0111966 | A1* | 4/2016 | Wang | H01F 27/2804 336/200 |
| 2018/0040410 | A1 | 2/2018 | Hamada et al. | |
| 2020/0177087 | A1* | 6/2020 | Warnes | H02M 3/33553 |
| 2023/0170128 | A1* | 6/2023 | Gazzano | H05K 1/165 361/784 |

FOREIGN PATENT DOCUMENTS

| | | |
|---|---|---|
| JP | 2011-087396 A | 4/2011 |
| WO | 2016/143527 A1 | 9/2016 |

* cited by examiner

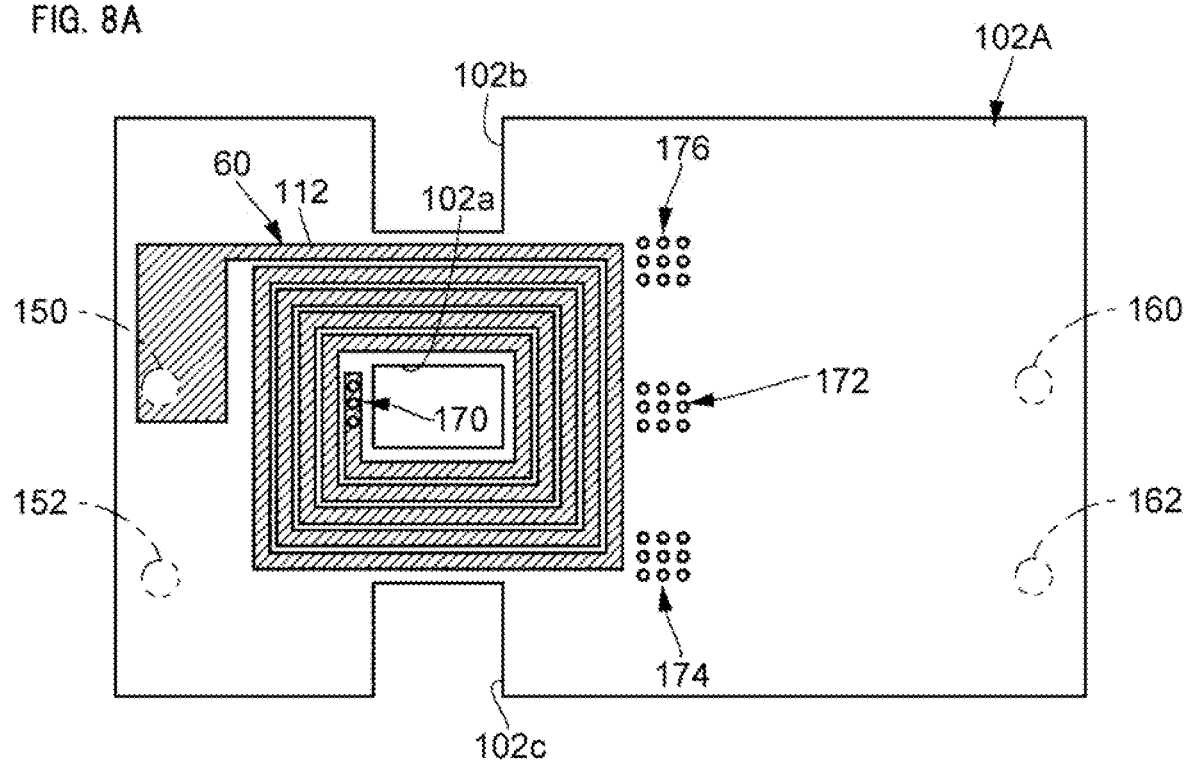
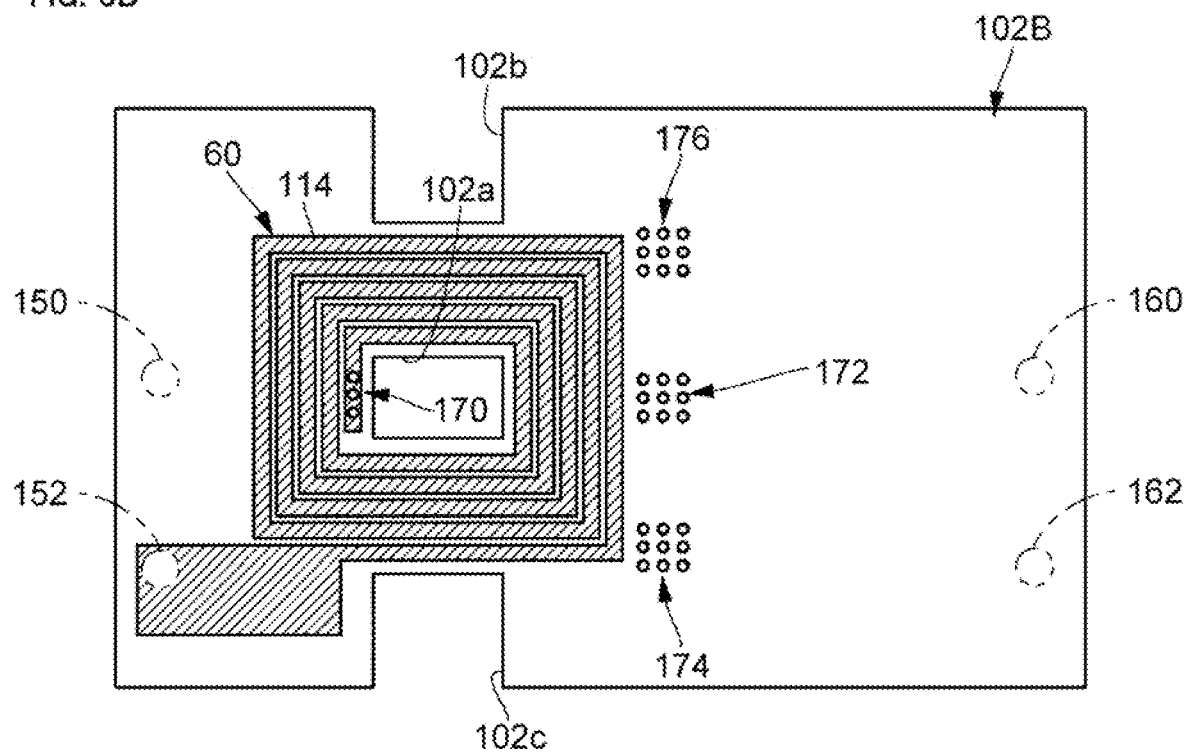

| | CONDITIONS |
|---|---|
| CIRCUIT OPERATION | PHASE-SHIFT FULL-BRIDGE |
| INPUT VOLTAGE | 400V |
| OUTPUT CURRENT | 100A |
| FREQUENCY | 500kHz |
| DUTY RATIO | 0.23 |
| TURNS RATIO OF TRANSFORMER | 10:1:1 |

US 11,923,125 B2

POWER CONVERSION DEVICE, MULTILAYER BOARD INCLUDED IN THE SAME, AND VEHICLE HAVING POWER CONVERSION DEVICE MOUNTED THEREIN

TECHNICAL FIELD

The present disclosure relates to a power conversion device, a multilayer board included in the same, and a vehicle having the power conversion device mounted therein. The present disclosure claims priority based on Japanese Patent Application No. 2018-239268 filed on Dec. 21, 2018, and the entire contents of the Japanese patent application are incorporated herein.

BACKGROUND ART

Electric vehicles (EVs), hybrid electric vehicles (HEVs), and plug-in hybrid electric vehicles (PHEVs) have a step-down DC/DC converter mounted therein. The step-down DC/DC converter is an insulating power conversion device for supplying power from a motor-driving high-voltage battery (for example, 300 V) to a low-voltage battery (for example, 12 V) or a low-voltage load.

For such an insulating power conversion device, a transformer for insulating an input side (primary side) and an output side (secondary side) from each other is used. Hitherto, there has been known a technique of using a multilayer board to form a transformer.

PTL 1 given below discloses such a technique. PTL 1 describes a multilayer board transformer in which a transformer is formed in a multilayer board by patterning conductive layers into coil shapes. This multilayer board transformer is formed by stacking and integrating a plurality of base members whose surfaces have coil patterns formed thereon, and then selectively connecting the coil patterns located up and down. The coil patterns can be formed by using a printing technique, such as a photolithography technique, and thus the number of wire-winding steps and variation can be reduced.

CITATION LIST

Patent Literature

PTL 1: JP 2010-093174A

SUMMARY OF INVENTION

A power conversion device according to a first aspect of the present disclosure includes a multilayer board including conductive layers that form a primary-side coil and a secondary-side coil of a transformer; and a circuit board electrically connected to the multilayer board, the circuit board having a first conversion circuit formed therein or thereon. The multilayer board includes a transformer region in which the transformer is formed; a core member which is disposed in the transformer region and around which the primary-side coil and the secondary-side coil are wound; a circuit formed region which is adjacent to the transformer region and in which a second conversion circuit is formed, the second conversion circuit being electrically connected to one coil of the primary-side coil and the secondary-side coil; and a terminal portion which is electrically connected to the other coil of the primary-side coil and the secondary-side coil. The first conversion circuit is electrically connected to the transformer via the terminal portion. The one coil connected to the second conversion circuit has a smaller number of turns than the other coil connected to the terminal portion.

A multilayer board according to a second aspect of the present disclosure is a multilayer board including conductive layers that are stacked. The multilayer board includes a transformer region in which the conductive layers form a primary-side coil and a secondary-side coil of a transformer; a circuit formed region which is adjacent to the transformer region and in which a circuit is formed, the circuit being electrically connected to one coil of the primary-side coil and the secondary-side coil; and a terminal portion which is electrically connected to the other coil of the primary-side coil and the secondary-side coil. The one coil has a smaller number of turns than the other coil.

A vehicle according to a third aspect of the present disclosure includes a power storage device that supplies power, the power conversion device according to the first aspect that converts the power supplied from the power storage device, and a load to which the power converted by the power conversion device is supplied.

BRIEF DESCRIPTION OF DRAWINGS

FIG. 8A is a plan view of a base member included in the transformer board.
FIG. 8B is a plan view of a base member included in the transformer board.

DESCRITPION OF EMBODIMENTS

Figure 1:
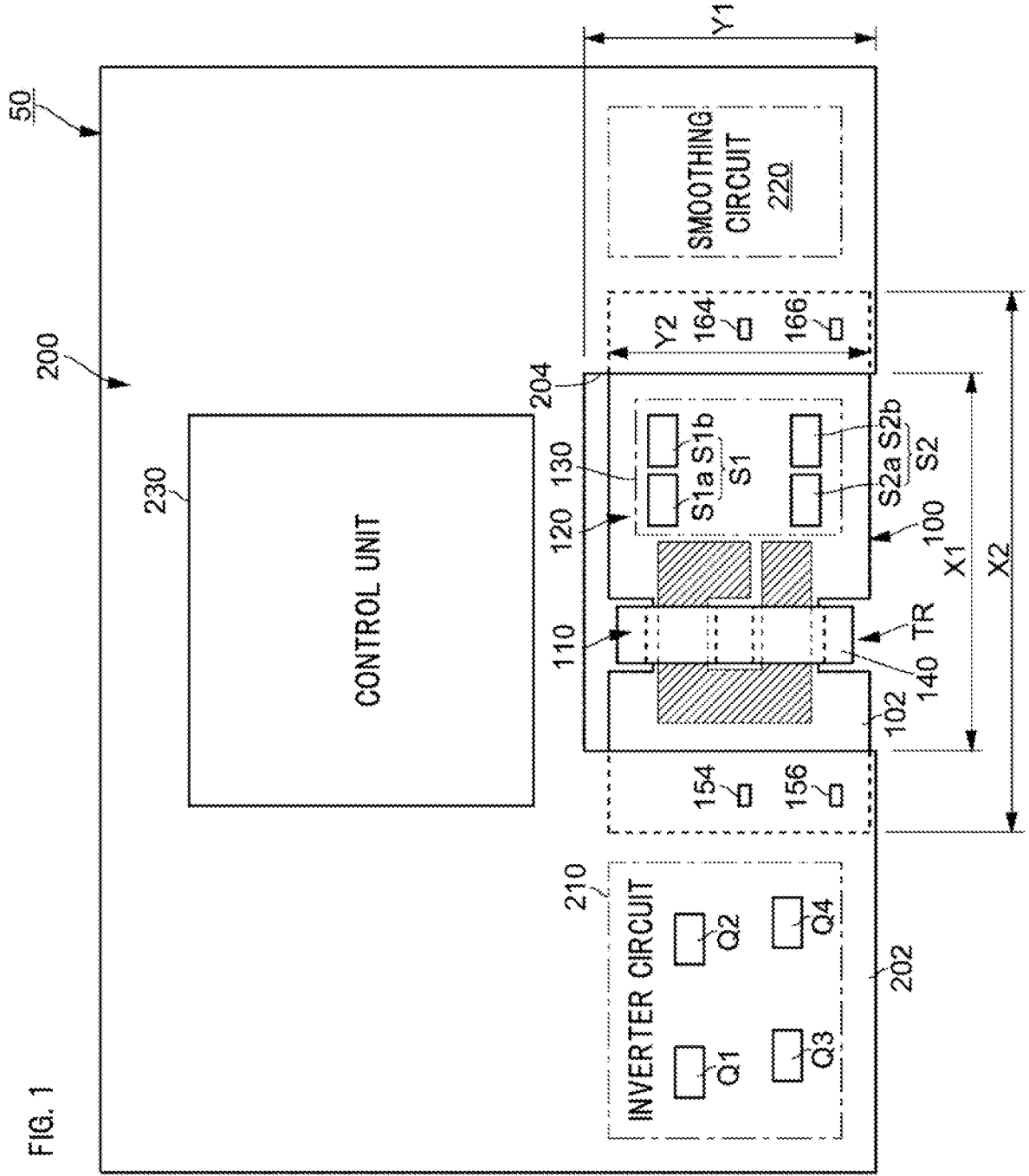
FIG. 1 is a plan view illustrating an overall configuration of a DC/DC converter according to a first embodiment.

Problems to be Solved by Present Disclosure

A multilayer board is typically high in cost. The cost further increases as the size of the board increases. Thus, in the case of using a multilayer board, it is preferable that the size thereof be not too large. In the multilayer board transformer according to PTL 1, an increase in board size can be suppressed because it is sufficient that a region for forming a transformer be secured.

However, the multilayer board transformer according to PTL 1 has a disadvantage that, when used as a transformer of a power conversion device, a wiring line connecting the transformer and a circuit portion is long as in a transformer other than the multilayer board transformer. Thus, there is an issue that a wiring inductance of the connection portion connecting the transformer and the circuit portion increases, which may have an adverse influence on a circuit operation.

Thus, an object of the present disclosure is to provide a power conversion device that is capable of suppressing an adverse influence of a wiring inductance on a circuit operation while suppressing an increase in the size of a multilayer board, the multilayer board used for the power conversion device, and a vehicle having the power conversion device mounted therein.

Advantageous Effects of Present Disclosure

According to the present disclosure, it is possible to obtain a power conversion device that is capable of suppressing an adverse influence of a wiring inductance on a circuit operation while suppressing an increase in the size of a multilayer board, the multilayer board used for the power conversion device, and a vehicle having the power conversion device mounted therein.

Description of Embodiments of Present Disclosure

First, preferred embodiments of the present disclosure will be described in order. At least parts of the embodiments described below may be combined in any manner.

To achieve the above-described object, the inventor of the present application earnestly studied, acquired the following findings, and reached the present disclosure: a wiring inductance of a connection portion of a circuit connected to a coil having a smaller number of turns, among circuits connected to a primary-side coil and a secondary-side coil of a transformer, has a larger adverse influence on a circuit operation.

(1) That is, a power conversion device according to a first aspect of the present disclosure includes a multilayer board including conductive layers that form a primary-side coil and a secondary-side coil of a transformer; and a circuit board electrically connected to the multilayer board, the circuit board having a first conversion circuit formed therein or thereon. The multilayer board includes a transformer region in which the transformer is formed; a core member which is disposed in the transformer region and around which the primary-side coil and the secondary-side coil are wound; a circuit formed region which is adjacent to the transformer region and in which a second conversion circuit is formed, the second conversion circuit being electrically connected to one coil of the primary-side coil and the secondary-side coil; and a terminal portion which is electrically connected to the other coil of the primary-side coil and the secondary-side coil. The first conversion circuit is electrically connected to the transformer via the terminal portion. The one coil connected to the second conversion circuit has a smaller number of turns than the other coil connected to the terminal portion.

The multilayer board has formed therein or thereon the transformer and the second conversion circuit that is electrically connected to the one coil having a smaller number of turns. As described above, the wiring inductance of the connection portion (wiring line) connecting the coil having a smaller number of turns and a circuit, among the circuits connected to the primary-side coil and the secondary-side coil of the transformer, has a larger adverse influence on a circuit operation. Thus, as a result of forming the second conversion circuit, which is connected to the coil having a smaller number of turns, in the circuit formed region, the second conversion circuit can be disposed near the transformer. Accordingly, the length of the wiring line connecting the transformer and the second conversion circuit can be reduced, and thus an increase in wiring inductance can be suppressed. As a result, an adverse influence of an increase in wiring inductance on a circuit operation can be suppressed.

The first conversion circuit is electrically connected to the other coil having a larger number of turns via the terminal portion. The wiring inductance of the connection portion (wiring line) connecting the coil having a larger number of turns and a circuit has a smaller adverse influence on a circuit operation. Thus, even when the first conversion circuit is formed in or on a wiring board different from the multilayer board (the circuit board), an adverse influence on a circuit operation can be suppressed. Furthermore, as a result of forming the first conversion circuit in or on the circuit board, the size of the multilayer board can be reduced compared to a case where both the first conversion circuit and the second conversion circuit are formed in or on the multilayer board. Accordingly, an increase in cost resulting from an increase in the size of the multilayer board can be suppressed. Note that "adjacent to" means "next to". Thus, the region adjacent to the transformer region (the circuit formed region) includes a region next to the transformer region.

(2) Preferably, the circuit board has a smaller number of layers than the multilayer board. Accordingly, the circuit board can be fabricated with a smaller number of fabrication steps than that for the multilayer board. Because the fabrication of the circuit board is facilitated, the use of the circuit board makes it possible to easily reduce the fabrication cost of the power conversion device.

(3) More preferably, the circuit board has a principal surface whose area is larger than an area of a principal surface of the multilayer board. Accordingly, the mount region of circuits can be easily secured while an increase in the size of the multilayer board is suppressed. Thus, for example, in a case where it is necessary to mount another circuit, the circuit can be easily mounted in or on the circuit board.

(4) More preferably, in the transformer region of the multilayer board, conductive layers constituting the primary-side coil and conductive layers constituting the secondary-side coil are alternately stacked. Accordingly, a cross flux between the primary-side coil and the secondary-side coil increases, and thus favorable coupling between the primary-side coil and the secondary-side coil can be achieved. As a result, leakage of a magnetic flux can be suppressed, and thus transmission efficiency can be increased and internal loss can be reduced.

(5) More preferably, the first conversion circuit includes a first switch circuit that converts a direct-current voltage into an alternating-current voltage, and the second conversion circuit includes a second switch circuit that rectifies the alternating-current voltage obtained through conversion by the first switch circuit. Accordingly, it is possible to easily obtain a step-down DC/DC converter capable of suppressing an adverse influence on a circuit operation.

(6) More preferably, the circuit formed region is provided in a region opposite the terminal portion with the transformer region interposed therebetween. Accordingly, the multilayer board and the circuit board can be easily electrically connected.

(7) More preferably, the circuit board includes a controller that controls driving of at least one of the first conversion circuit and the second conversion circuit. Accordingly, driving of at least one of the first conversion circuit and the second conversion circuit can be easily controlled.

(8) A multilayer board according to a second aspect of the present disclosure is a multilayer board including conductive layers that are stacked. The multilayer board includes a transformer region in which the conductive layers form a primary-side coil and a secondary-side coil of a transformer; a circuit formed region which is adjacent to the transformer region and in which a circuit is formed, the circuit being electrically connected to one coil of the primary-side coil and the secondary-side coil; and a terminal portion which is electrically connected to the other coil of the primary-side coil and the secondary-side coil. The one coil has smaller number of turns than the other coil. The use of the multilayer board makes it possible to easily obtain a power conversion device capable of suppressing an adverse influence of a wiring inductance on a circuit operation while suppressing an increase in the size of the multilayer board.

(9) Preferably, the multilayer board further includes an electronic component which is mounted in the circuit formed region and which constitutes the circuit, and a core member which is disposed in the transformer region and around which the primary-side coil and the secondary-side coil are wound. The use of the multilayer board makes it possible to easily obtain a power conversion device capable of suppressing an adverse influence of a wiring inductance on a circuit operation while suppressing an increase in the size of the multilayer board.

(10) A vehicle according to a third aspect of the present disclosure includes a power storage device that supplies power, the power conversion device according to the first aspect that converts the power supplied from the power storage device, and a load to which the power converted by the power conversion device is supplied. Accordingly, in the vehicle, the power supplied from the power storage device can be efficiently converted by the power conversion device and can be supplied to the load.

Details of Embodiments of Present Disclosure

A specific example of a power conversion device, a multilayer board, and a vehicle according to embodiments of the present disclosure will be described below with reference to the drawings. In the following embodiments, the same components are denoted by the same reference numerals. These components have the same functions and names. Thus, a detailed description of these components will not be repeated.

First Embodiment

[Overall Configuration]
Referring to FIG. 1, a power conversion device according to the present embodiment is a step-down DC/DC converter 50, which is a kind of insulating power conversion device. The DC/DC converter 50 includes a multilayer board 100 in which a transformer TR is formed (hereinafter referred to as a "transformer board 100"), and a circuit board 200 to which the transformer board 100 is attached (hereinafter referred to as a "main board 200").

The DC/DC converter 50 has a structure in which main elements constituting the DC/DC converter 50 are disposed in or on the transformer board 100 and the main board 200 in a distributed manner. That is, the elements not mounted in or on the transformer board 100 are disposed in or on the main board 200. Accordingly, an increase in the size of the transformer board 100 is suppressed.

Figure 2:
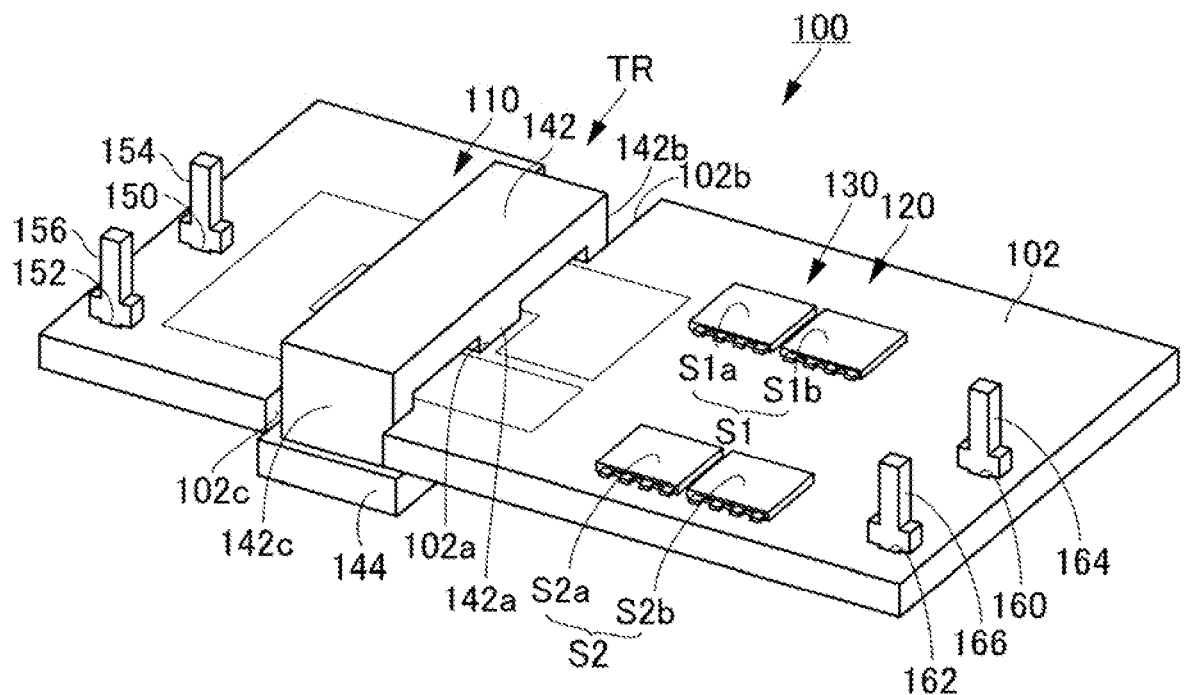
FIG. 2 is a perspective view of a transformer board included in the DC/DC converter.
Figure 3:
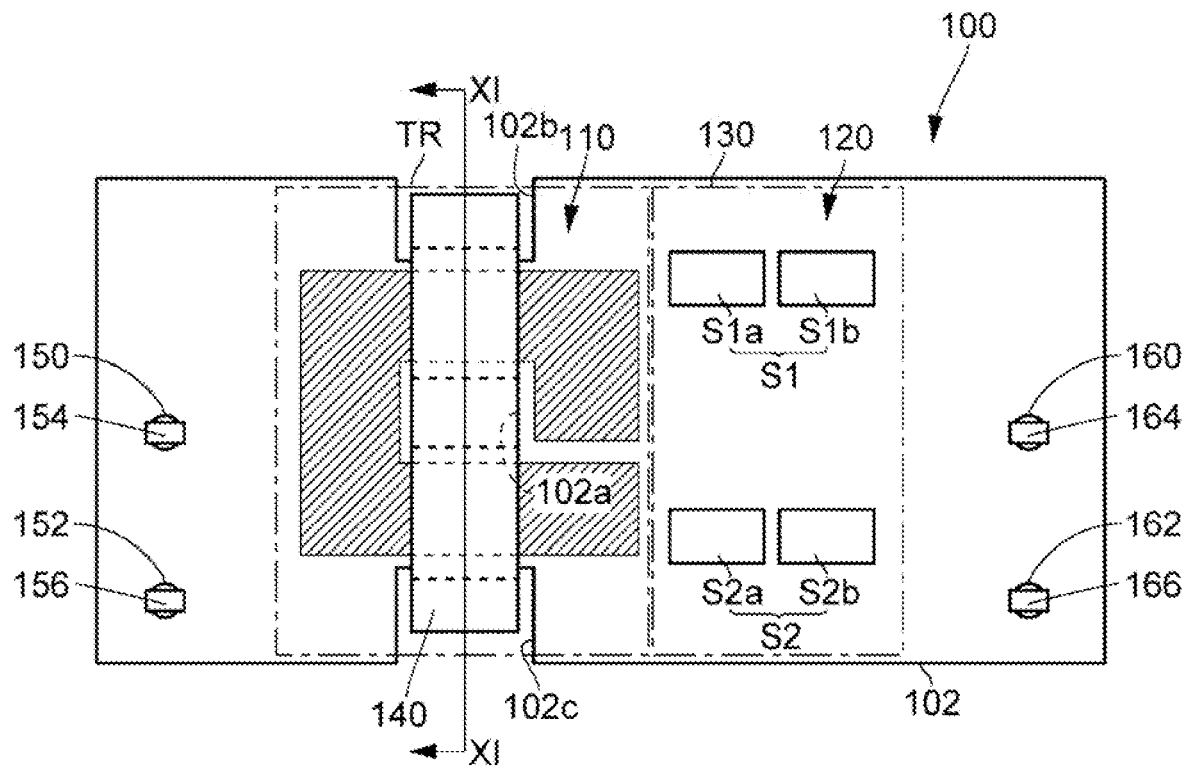
FIG. 3 is a plan view of the transformer board illustrated in FIG. 2.

[Configuration of Transformer Board 100]
Referring to FIG. 2 and FIG. 3, the transformer board 100 includes a transformer region 110 in which the transformer TR is formed, and a circuit formed region 120 which is a region adjacent to the transformer region 110 and in which a rectifier circuit 130 is formed. In the transformer region 110, a primary-side coil and a secondary-side coil of the transformer TR are formed. The primary-side coil and the secondary-side coil are formed by patterning conductive layers included in the transformer board 100 into coil shapes. The primary-side coil has a larger number of turns than the secondary-side coil. In other words, the number of turns of the secondary-side coil is smaller than the number of turns of the primary-side coil. Furthermore, the conductive layers constituting the primary-side coil and the conductive layers constituting the secondary-side coil are alternately stacked in the transformer region 110. The details of the primary-side coil and the secondary-side coil will be described below.

The transformer board 100 has a structure in which a plurality of conductive layers (wiring layers) are stacked and integrated. In the present embodiment, the number of layers included in the transformer board 100 is four. That is, the transformer board 100 includes a printed wiring board 102 having a four-layer structure.

Figure 5:
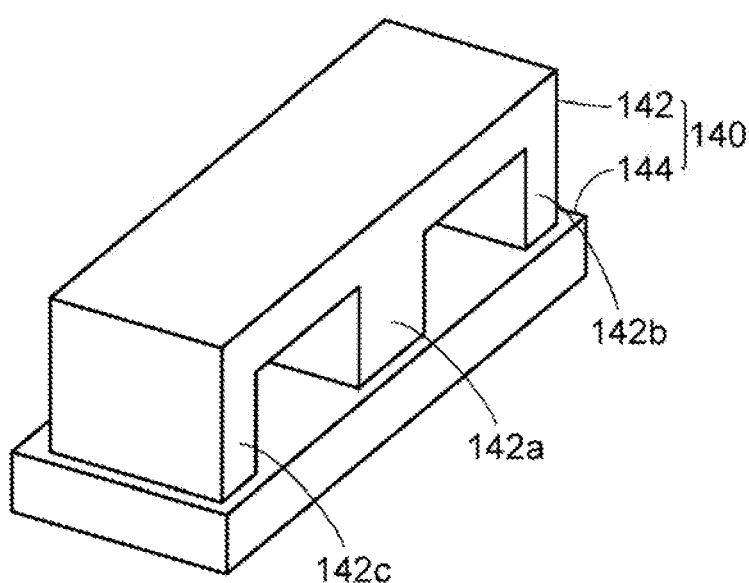
FIG. 5 is a perspective view of the core member used for the transformer board.

In the transformer region 110 of the transformer board 100, a core member 140 around which the primary-side coil and the secondary-side coil are wound is disposed. Referring to FIG. 5, the core member 140 is an EI-shaped transformer core and includes an E-shaped core 142 and an I-shaped core 144. The E-shaped core 142 includes a center magnetic leg 142a and side magnetic legs 142b and 142c.

Figure 4:
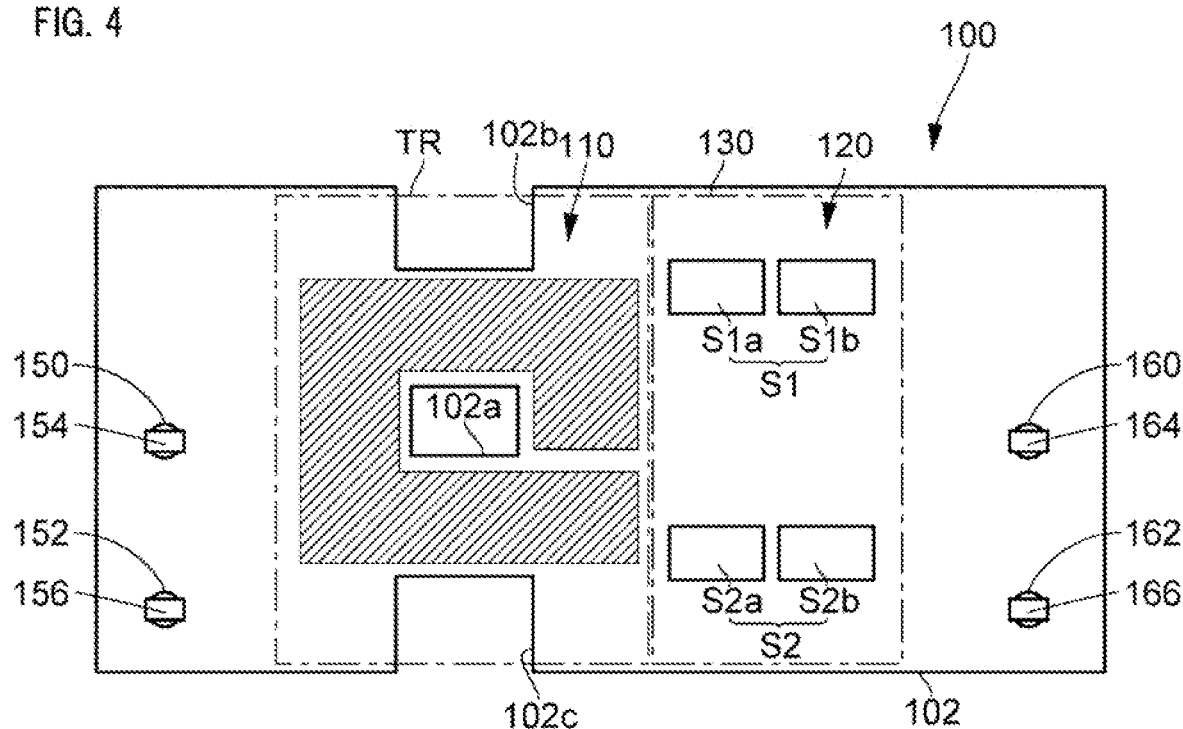
FIG. 4 is a plan view illustrating a state in which a core member has been removed from the transformer board illustrated in FIG. 2.

Referring to FIG. 4, a through-hole 102a and notch portions 102b and 102c are formed in the transformer region 110. The through-hole 102a and the notch portions 102b and 102c are each rectangular-shaped. The notch portion 102b is formed at one end side of the transformer board 100 in a transversal direction with respect to the through-hole 102a, whereas the notch portion 102c is formed at the other end side of the transformer board 100 in the transversal direction with respect to the through-hole 102a.

Referring back to FIG. 2, the center magnetic leg 142a of the E-shaped core 142 extends through the through-hole 102a of the transformer board 100. The side magnetic legs 142b and 142c of the E-shaped core 142 extend through the notch portions 102b and 102c, respectively. The I-shaped core 144 is disposed so as to face an end of the center magnetic leg 142a and ends of the side magnetic legs 142b and 142c of the E-shaped core 142.

Electronic components for constituting a circuit are mounted in the circuit formed region 120 of the transformer board 100. Specifically, switch elements S1 and S2 constituting the rectifier circuit 130 are mounted in the circuit formed region 120. The switch elements S1 and S2 are each formed of, for example, a metal-oxide-semiconductor field-effect transistor (MOSFET). The switch elements S1 and S2 each may be a power semiconductor device other than a MOSFET, for example, an insulated gate bipolar transistor (IGBT), a high electron mobility transistor (HEMT), or the like.

The rectifier circuit 130 is a push-pull circuit including the switch elements S1 and S2. The switch element S1 includes switch elements S1a and S1b connected in parallel to each other. That is, the switch element S1 has a configuration in which turning ON/OFF is performed by using the two switch elements S1a and S1b for one switching operation, in view of a large current flowing through the rectifier circuit 130. Likewise, the switch element S2 includes switch elements S2a and S2b connected in parallel to each other. The switch elements S1 and S2 each may have a configuration using one switch element or a configuration using three or more switch elements.

Referring to FIG. 2 and FIG. 3, the transformer board 100 further includes input-side terminal portions 150 and 152 and output-side terminal portions 160 and 162. The input-side terminal portions 150 and 152 are disposed at one end side of the transformer board 100 in a longitudinal direction, and the output-side terminal portions 160 and 162 are disposed at the other end side of the transformer board 100 in the longitudinal direction. The terminal portions 150, 152, 160, and 162 are each formed of a through-hole.

The circuit formed region 120 is provided in a region opposite the input-side terminal portions 150 and 152 with the transformer region 110 interposed therebetween, so as to be adjacent to the transformer region 110. That is, the circuit formed region 120 is provided so as to be next to the transformer region 110. The output-side terminal portions 160 and 162 are provided opposite the transformer region 110 with the circuit formed region 120 interposed therebetween. An input side of the rectifier circuit 130 formed in the circuit formed region 120 is electrically connected to the secondary-side coil of the transformer TR, and an output side thereof is electrically connected to the output-side terminal portions 160 and 162.

Terminal pins 154 and 156 are attached to the input-side terminal portions 150 and 152, respectively. The terminal portion 150 and the terminal pin 154 are electrically connected, and the terminal portion 152 and the terminal pin 156 are electrically connected. Likewise, terminal pins 164 and 166 are attached to the output-side terminal portions 160 and 162, respectively. The terminal portion 160 and the terminal pin 164 are electrically connected, and the terminal portion 162 and the terminal pin 166 are electrically connected.

[Configuration of Main Board 200]

Figure 6:
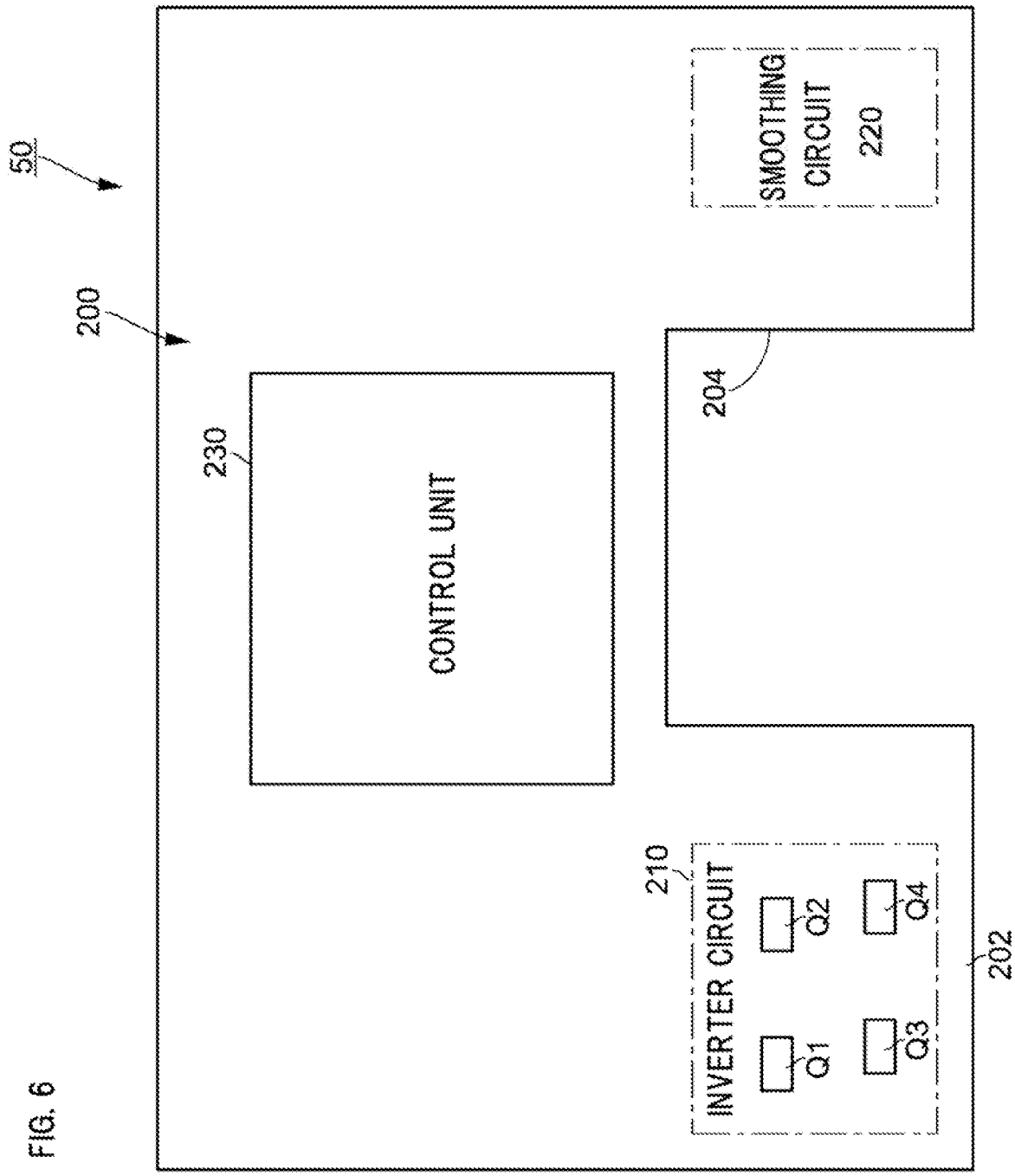
FIG. 6 is a plan view of a main board included in the DC/DC converter.

Referring to FIG. 6, the main board 200 is formed of a printed wiring board 202 including a smaller number of layers than the transformer board 100. As the printed wiring board 202, a single-sided board having a wiring layer formed on only one surface (principal surface) thereof, or a double-sided board having wiring layers formed on both surfaces (principal surfaces) thereof, may be used. As the printed wiring board 202, a multilayer board including three layers may be used. The main board 200 has a larger board size than the transformer board 100. That is, the area of a principal surface of the main board 200 is larger than the area of a principal surface of the transformer board 100. A rectangular notch portion 204, in which the transformer board 100 is to be disposed, is formed on one side of the main board 200.

Referring back to FIG. 1, a width X1 of the notch portion 204 is smaller than a length X2 of the transformer board 100 in the longitudinal direction, and a length Y1 in a depth direction is larger than a length Y2 of the transformer board 100 in the transversal direction. The transformer board 100 is disposed in the notch portion 204 of the main board 200 such that both end portions thereof in the longitudinal direction overlap the main board 200, and is attached to the main board 200 via the terminal pins 154, 156, 164, and 166. Accordingly, the transformer region 110 and the circuit formed region 120 of the transformer board 100 are exposed on a front surface side of the main board 200 via the notch portion 204 of the main board 200. Thus, interference of the core member 140 in the transformer region 110 and the switch elements in the circuit formed region 120 with the main board 200 is suppressed.

The main board 200 further includes an inverter circuit 210, a smoothing circuit 220, and a controller 230. The inverter circuit 210 includes four switch elements Q1 to Q4 that are full-bridge connected. An output side of the inverter circuit 210 is electrically connected to the primary-side coil of the transformer TR via the input-side terminal portions 150 and 152 (the terminal pins 154 and 156) of the transformer board 100. The switch elements Q1 to Q4 are each formed of, for example, a MOSFET. Alternatively, the switch elements Q1 to Q4 each may be a power semiconductor device other than a MOSFET, for example, an IGBT, an HEMT, or the like.

The smoothing circuit 220 is a circuit that removes pulsating current included in a rectified output from the rectifier circuit 130 to achieve smoothing. An input side of the smoothing circuit 220 is electrically connected to an output side of the rectifier circuit 130 via the output-side terminal portions 160 and 162 (the terminal pins 164 and 166) of the transformer board 100. The controller 230 is a microcomputer including a central processing unit (CPU), a memory, and so forth (not illustrated), and controls driving of the inverter circuit 210 and the rectifier circuit 130. The controller 230 may be a controlling IC, such as an analog IC or a field-programmable gate array (FPGA). The illustration of a wiring line or the like connecting the controller 230 and the transformer board 100 is omitted.

[Circuit Configuration]

Figure 7:
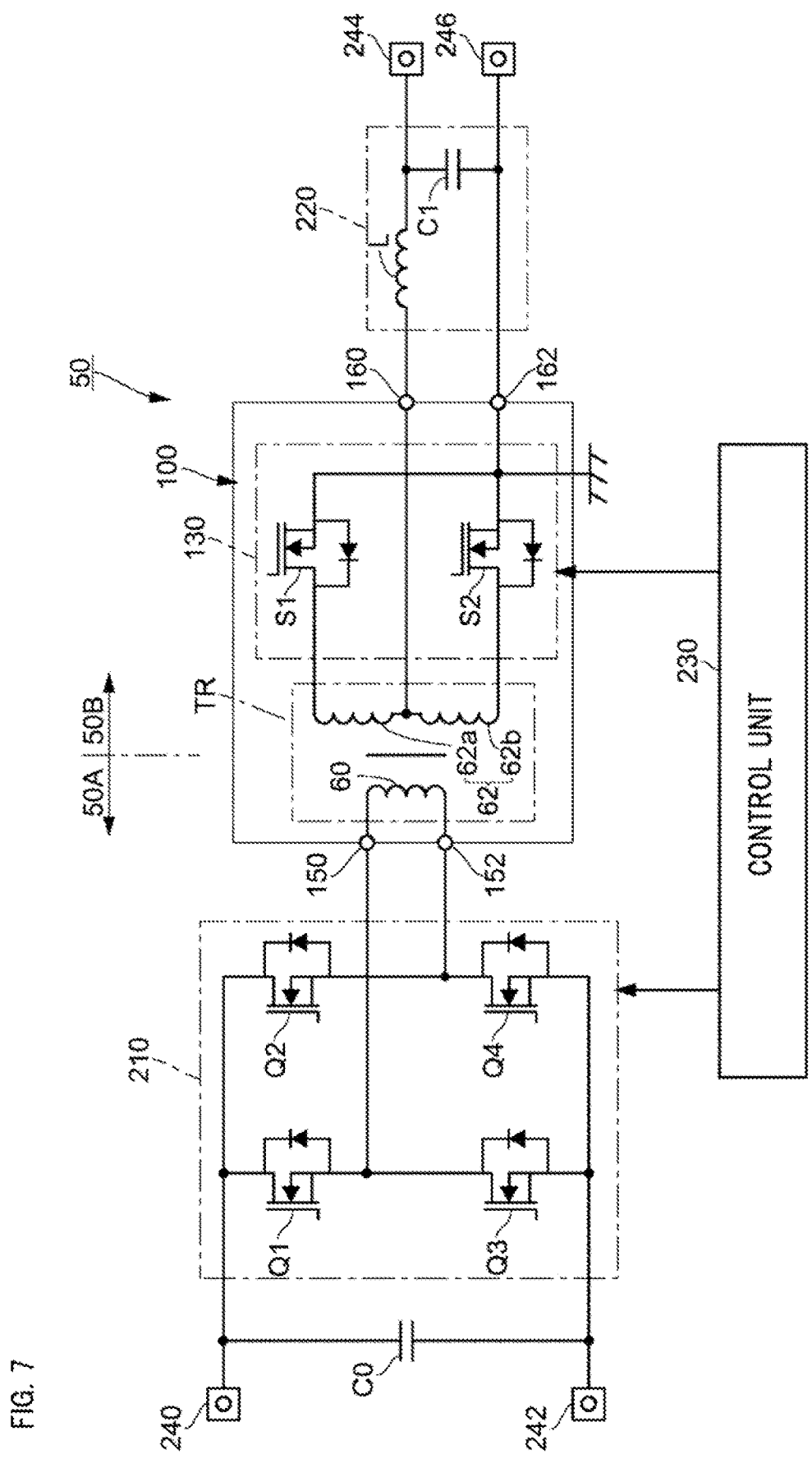
FIG. 7 is a circuit diagram of the DC/DC converter according to the first embodiment.

Referring to FIG. 7, the DC/DC converter 50 includes the transformer TR, a primary-side portion 50A and a secondary-side portion 50B the boundary of which corresponds to the transformer TR, and the controller 230. The primary-side portion 50A includes a capacitor C0 connected between two input terminals 240 and 242, and the inverter circuit 210. The secondary-side portion 50B includes the rectifier circuit 130 and the smoothing circuit 220. A high direct-current voltage is applied to the input terminals 240 and 242. The high direct-current voltage input through the input terminals 240 and 242 is converted into a low direct-current voltage by the DC/DC converter 50 and is output from output terminals 244 and 246.

The input terminals 240 and 242, the capacitor C0, the inverter circuit 210, the smoothing circuit 220, the output terminals 244 and 246, and the controller 230 are provided in or on the main board 200. The transformer TR and the rectifier circuit 130 are provided in or on the transformer board 100.

The transformer TR is a center-tapped transformer and includes a primary-side coil 60, a secondary-side coil 62, and the core member 140. The secondary-side coil 62 includes a first coil 62a and a second coil 62b connected in series to the first coil 62a. The turns ratio between the primary-side coil 60 and the secondary-side coil 62 (the first coil 62a and the second coil 62b), that is, the number of turns of the primary-side coil 60: the number of turns of the first coil 62a: the number of turns of the second coil 62b is, for example, 10:1:1.

The inverter circuit 210 includes the switch elements Q1 and Q3 connected in series between the input terminals 240 and 242 and in parallel to the capacitor C0, and also includes the switch elements Q2 and Q4 connected in parallel to the capacitor C0 and the switch elements Q1 and Q3 between the input terminals 240 and 242. Drains of the switch elements Q1 and Q2 are connected to the input terminal 240. Sources of the switch elements Q3 and Q4 are connected to the input terminal 242. A source of the switch element Q1 and a drain of the switch element Q3 are connected to each other. Likewise, a source of the switch element Q2 and a drain of the switch element Q4 are connected to each other.

A node between the switch elements Q1 and Q3 is connected to one end of the primary-side coil 60 of the transformer TR via the input-side terminal portion 150. The other end of the primary-side coil 60 of the transformer TR is connected to a node between the switch elements Q2 and Q4 via the input-side terminal portion 152.

The rectifier circuit 130 rectifies an output from the inverter circuit 210 transmitted via the transformer TR. The rectifier circuit 130 includes the switch elements S1 and S2. In FIG. 7, the switch elements S1a and S1b, which are functionally the same, are collectively illustrated as the switch element S1. Likewise, the switch elements S2a and S2b, which are functionally the same, are collectively illustrated as the switch element S2.

A drain of the switch element S1 is connected to one end of the secondary-side coil 62 (one end of the first coil 62a), and a drain of the switch element S2 is connected to the other end of the secondary-side coil 62 (the other end of the second coil 62b). The other end of the first coil 62a is connected to one end of the second coil 62b, and a node therebetween is connected to the output-side terminal portion 160. A source of the switch element S1 and a source of the switch element S2 are connected to the output-side terminal portion 162.

The smoothing circuit 220 includes a coil L connected in series to the node of the secondary-side coil 62 (the node between the first coil 62a and the second coil 62b) via the output-side terminal portion 160 (the terminal pin 164), and a capacitor C1 connected between the output terminals 244 and 246.

The controller 230 controls driving of the switch elements Q1 to Q4 constituting the inverter 210 and the switch elements S1 and S2 constituting the rectifier circuit 130.

[Coil Configuration of Transformer TR]

The transformer board 100 is formed by stacking a plurality of base members each having a conductive layer formed on a surface thereof. The base member is composed of, for example, an insulating material such as glass epoxy, and the conductive layer is composed of, for example, a conductive material such as copper. The conductive layer is patterned into a desired shape by using a photolithography technique or the like. Specifically, a resist provided on the conductive layer is patterned by using a photolithography technique or the like and then the conductive layer is etched by using the resist as a mask. Accordingly, the conductive layer is patterned into the desired shape.

Referring to FIG. 8A and FIG. 8B, the primary-side coil 60 includes two layers, a first-half portion and a latter-half portion. Specifically, the primary-side coil 60 is constituted by a conductive layer 112 formed in a coil shape on a surface of a base member 102A (see FIG. 8A) and a conductive layer 114 formed in a coil shape on a surface of a base member 102B (see FIG. 8B). The coil-shaped conductive layer 112 is formed so as to be wound by five turns around the through-hole 102a through which the center magnetic leg 142a of the core member 140 (see FIG. 5) extends. Likewise, the coil-shaped conductive layer 114 is formed so as to be wound by five turns around the through-hole 102a through which the center magnetic leg 142a of the core member 140 (see FIG. 5) extends. One end of the conductive layer 112 is electrically connected to the input-side terminal portion 150, and the other end of the conductive layer 114 is electrically connected to the input-side terminal portion 152. The other end of the conductive layer 112 and one end of the conductive layer 114 are electrically connected via a via 170.

Figure 9A:
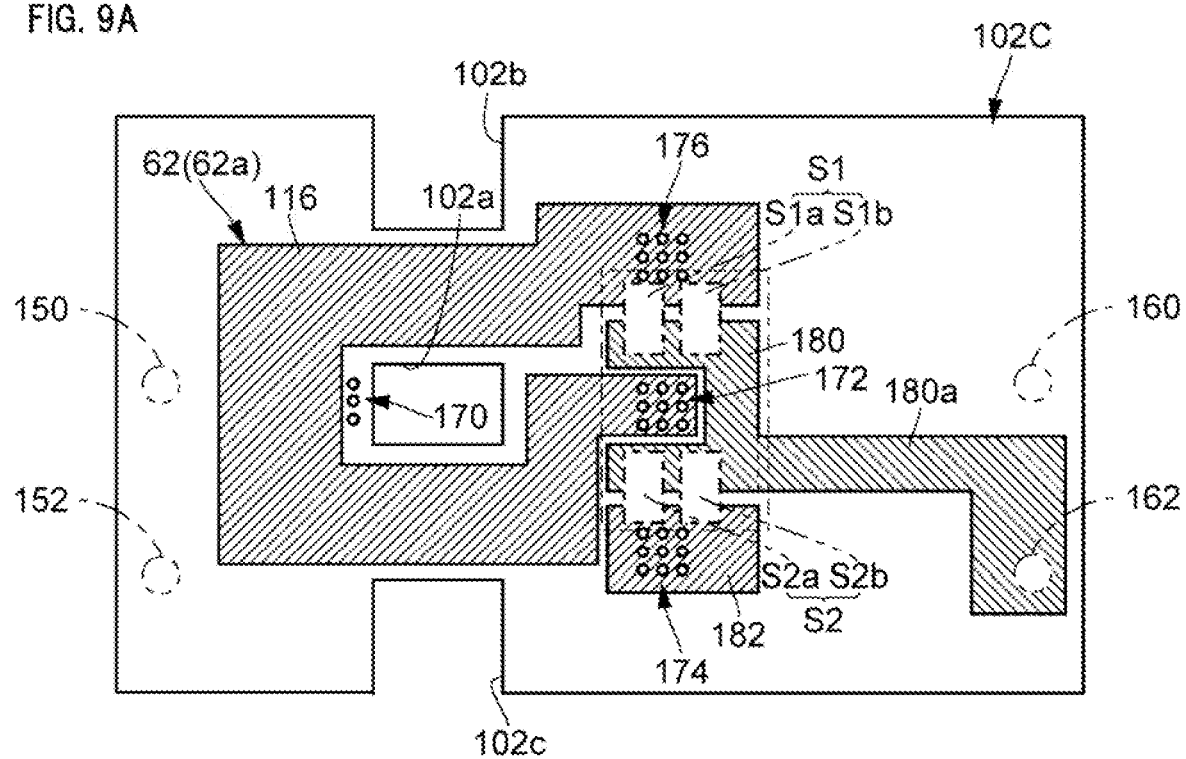
FIG. 9A is a plan view of a base member included in the transformer board.
Figure 9B:
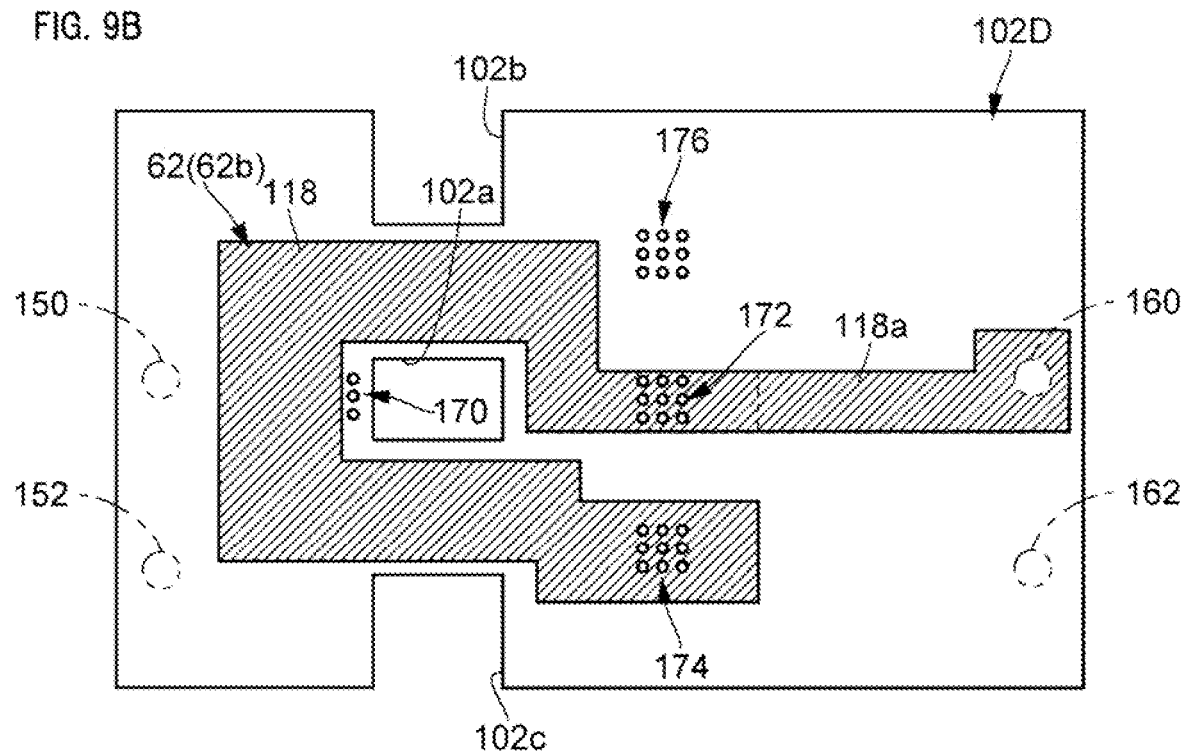
FIG. 9B is a plan view of a base member included in the transformer board.

Referring to FIG. 9A and FIG. 9B, the first coil 62a included in the secondary-side coil 62 is formed of a conducive layer 116 formed in a coil shape on a surface of a base member 102C (see FIG. 9A). The second coil 62b included in the secondary-side coil 62 is formed of a conducive layer 118 formed in a coil shape on a surface of a base member 102D (see FIG. 9B). The first coil 62a (the conductive layer 116) and the second coil 62b (the conductive layer 118) are each formed so as to be wound by one turn around the through-hole 102a. On the surface of the base member 102C on which the coil-shaped conductive layer 116 is formed, a conductive layer 180 connected to the sources of the switch elements S1 and S2 and a conductive layer 182 connected to the drain of the switch element S2 are formed. The conductive layer 180 connected to the sources of the switch elements S1 and S2 is also electrically connected to the output-side terminal portion 162 via a wiring portion 180a that is integrated with the conductive layer 180. The drain of the switch element S1 is connected to one end of the coil-shaped conductive layer 116.

The other end of the coil-shaped conductive layer 116 (see FIG. 9A) is electrically connected to one end of the coil-shaped conductive layer 118 (see FIG. 9B) via a via 172. The one end of the conductive layer 118 is also electrically connected to the output-side terminal portion 160 via a wiring portion 118a that is integrated with the conductive layer 118. The conductive layer 182 connected to the drain of the switch element S2 (see FIG. 9A) is electrically connected to the other end of the coil-shaped conductive layer 118 (see FIG. 9B) via a via 174.

Figure 10:
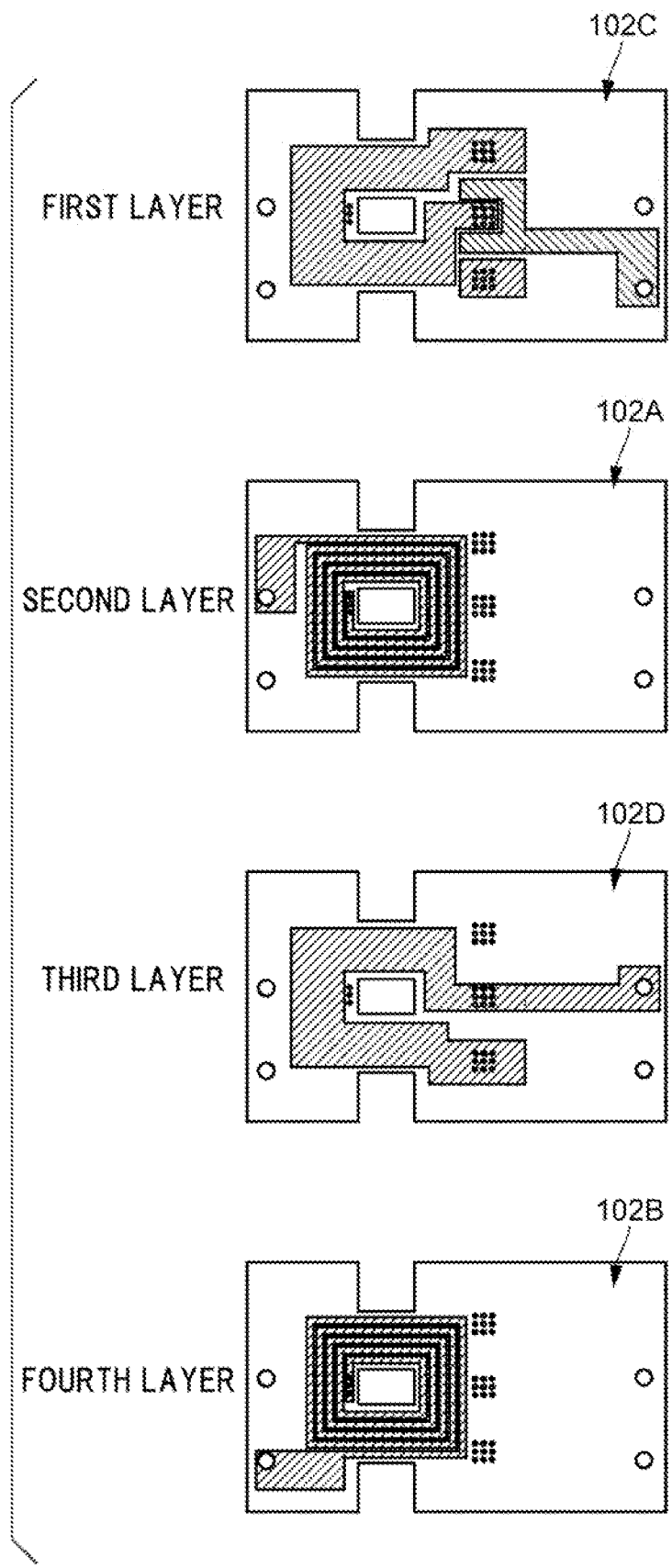
FIG. 10 is a plan view of base members included in the transformer board.
Figure 11:
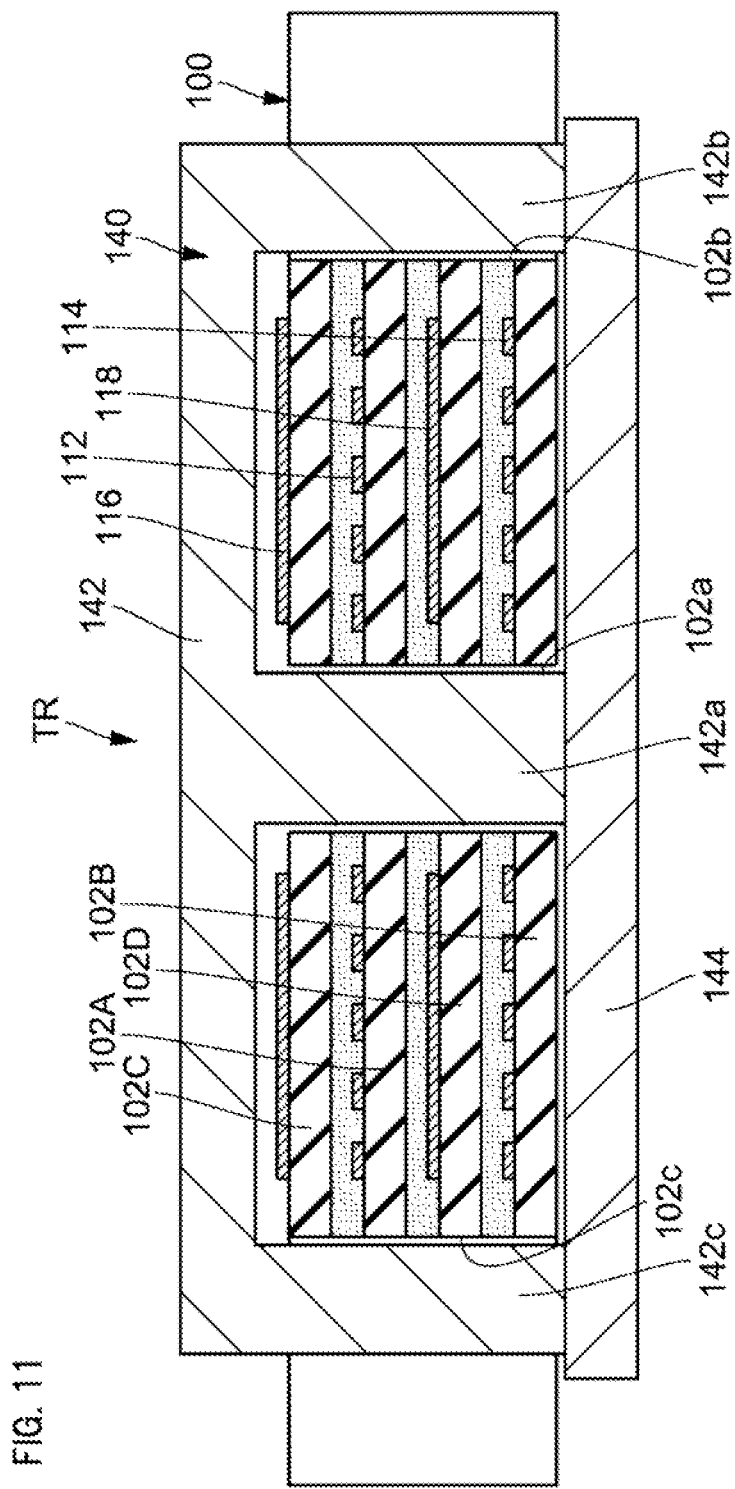
FIG. 11 is a sectional view taken along line XI-XI in FIG. 3.

Referring to FIG. 10, the transformer board 100 includes the base member 102C, the base member 102A, the base member 102D, and the base member 102B serving as first to fourth layers, respectively, which are stacked and integrated with an insulating adhesive such as prepreg therebetween. Referring to FIG. 11, in the transformer board 100 formed in this manner, the conductive layers 112 and 114 constituting the primary-side coil 60 and the conductive layers 116 and 118 constituting the secondary-side coil 62 are alternately stacked in the transformer region 110, as described above.

[Determination by Simulation]

A description will be given of the details of a simulation performed to determine which wiring line has an influence on a circuit operation in the case of using a transformer in which the secondary-side coil has a smaller number of turns than the primary-side coil.

Figures 12, 13:
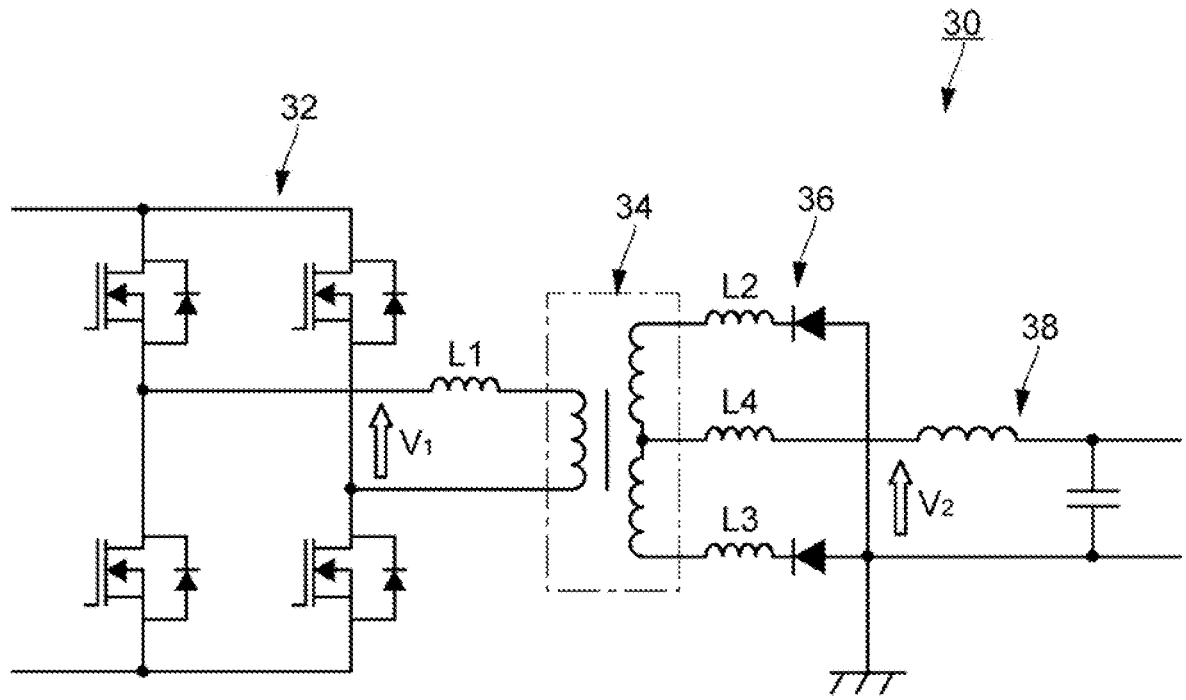
FIG. 12 is a diagram illustrating a circuit configuration used for a simulation.
FIG. 13 is a diagram illustrating conditions of the simulation.

FIG. 12 illustrates a circuit configuration used for the simulation. Referring to FIG. 12, a circuit 30 is a circuit made by imitating the circuit configuration of the DC/DC converter 50 according to the present embodiment (see FIG. 7). The circuit 30 includes an inverter circuit 32 including four switch elements, a transformer 34, a rectifier circuit 36, and a smoothing circuit 38. For the rectifier circuit 36, diodes are used instead of switch elements. The transformer 34 is a center-tapped transformer like the transformer TR and includes a primary-side coil and a secondary-side coil. The secondary-side coil includes a first coil and a second coil. In this circuit configuration, wiring inductances L1 to L4 were set to individual wiring lines on the primary side and the secondary side of the transformer 34. The wiring inductance L1 is the wiring inductance of a wiring line connecting the primary-side coil and the inverter circuit 32, and the wiring inductances L2 and L3 are the wiring inductances of wiring lines connecting the secondary-side coil and the rectifier circuit 36. The wiring inductance L4 is the wiring inductance of a wiring line connecting a node of the secondary-side coil (a node between the first coil and the second coil) and the smoothing circuit 38.

When power transmission is hindered by a wiring inductance, the drive duty ratio of the inverter circuit 32 decreases, and the output voltage of the DC/DC converter decreases. Thus, the output voltages when the wiring inductances L1 to L4 were 1 nH, 5 nH, 10 nH, and 100 nH were compared with each other.

FIG. 13 illustrates simulation conditions. Referring to FIG. 13, the circuit operation was phase-shift full-bridge. The input voltage was 400 V, and the output current was 100 A. The driving frequency of each switch element was 500 kHz, and the duty ratio was 0.23. The turns ratio of the transformer (the number of turns of the primary-side coil: the number of turns of the first coil: the number of turns of the second coil) was 10:1:1 as in the present embodiment.

Figure 14:
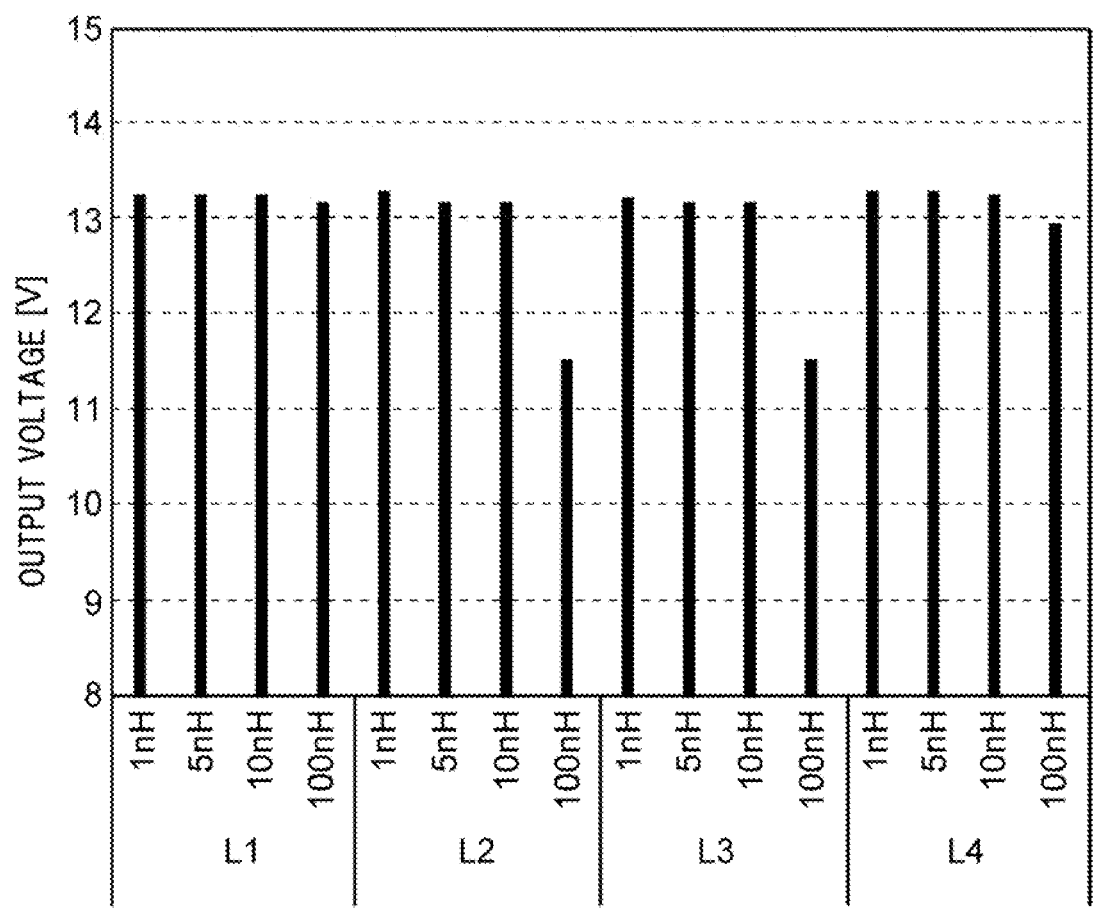
FIG. 14 is a graph illustrating a result of the simulation.

FIG. 14 illustrates the result of the simulation. Referring to FIG. 14, a decrease in the output voltage was not observed when the wiring inductance L1 on the primary side had a value of any of 1 nH, 5 nH, 10 nH, and 100 nH. In contrast, on the secondary side, a trend of decrease in the output voltage was observed when the wiring inductance L2 had a value of 100 nH and when the wiring inductance L3 had a value of 100 nH. A trend of decrease in the output voltage was also observed when the wiring inductance L4 had a value of 100 nH, but the degree of decrease was small. That is, the result indicates that the wiring inductances L2 and L3 of the connection portion (wiring lines) connecting the transformer 34 and the rectifier circuit 36 have a larger adverse influence on the circuit operation than the wiring inductance L1 on the primary side.

From the above simulation result, it was determined that an increase in the wiring inductance L1 on the primary side has a small adverse influence on the output voltage, that is, the circuit operation, and that an increase in the wiring inductances L2 and L3 on the secondary side has a large adverse influence on the output voltage.

Advantageous Effects of Present Embodiment

As is clear from the above description, the DC/DC converter 50 according to the present embodiment has advantageous effects described below.

The transformer board 100 has the transformer TR and the rectifier circuit 130 formed therein or thereon. The rectifier circuit 130 is electrically connected to the secondary-side coil 62 having a smaller number of turns. As described above, the wiring inductance of the connection portion (wiring line) connecting the coil having a smaller number of turns and a circuit, among the circuits connected to the primary-side coil 60 and the secondary-side coil 62 of the transformer TR, has a larger adverse influence on a circuit operation. As a result of forming the rectifier circuit 130, which is connected to the secondary-side coil 62 having a smaller number of turns, in the circuit formed region 120, the rectifier circuit 130 can be disposed near the transformer TR. Accordingly, the length of the wiring line connecting the transformer TR and the rectifier circuit 130 can be reduced, and thus an increase in wiring inductance can be suppressed. As a result, an adverse influence of an increase in wiring inductance on a circuit operation (a decrease in output voltage) can be suppressed.

The inverter circuit 210 is electrically connected to the primary-side coil 60 having a larger number of turns via the input-side terminal portions 150 and 152. The wiring inductance of the connection portion (wiring line) connecting the coil having a larger number of turns and a circuit has a smaller adverse influence on a circuit operation. Thus, even when the inverter circuit 210 is formed in or on a wiring board different from the transformer board 100 (the main board 200), an adverse influence on a circuit operation can be suppressed. Furthermore, as a result of forming the inverter circuit 210 in or on the main board 200, the size of the transformer board 100 can be reduced compared to a case where both the inverter circuit 210 and the rectifier circuit 130 are formed in or on the transformer board 100. Accordingly, an increase in cost resulting from an increase in the size of the transformer board 100 can be suppressed.

Furthermore, as a result of forming the DC/DC converter 50 so as to include the transformer board 100 and the main board 200, the transformer board 100 and the main board 200 can be individually designed, and thus the degree of freedom of design increases. In addition, the transformer board 100 can be used for another device.

As a result of making the number of layers of the main board 200 smaller than the number of layers of the transformer board 100, the main board 200 can be fabricated with a smaller number of fabrication steps than that for the transformer board 100. Because the fabrication of the main board 200 is facilitated, the use of the main board 200 leads to a decrease in the number of fabrication steps, a decrease in fabrication time, and so forth. Accordingly, the fabrication cost of the power conversion device can be easily reduced.

As a result of making the area of a principal surface of the main board 200 larger than the area of a principal surface of the transformer board 100, the mount region of circuits can be easily secured while an increase in the size of the transformer board 100 is suppressed. Thus, for example, in a case where it is necessary to mount another circuit, such as a filter circuit, the circuit can be easily mounted in or on the main board 200.

In the transformer region 110 of the transformer board 100, the conductive layers 112 and 114 constituting the primary-side coil 60 and the conductive layers 116 and 118 constituting the secondary-side coil 62 are alternately stacked. Accordingly, a cross flux between the primary-side coil 60 and the secondary-side coil 62 increases, and thus favorable coupling between the primary-side coil 60 and the secondary-side coil 62 can be achieved. As a result, leakage of a magnetic flux can be suppressed, and thus transmission efficiency can be increased and internal loss can be reduced.

As a result of providing the circuit formed region 120 in a region opposite the input-side terminal portions 150 and 152 with the transformer region 110 interposed therebetween, the transformer board 100 and the main board 200 can be easily electrically connected.

Furthermore, as a result of mounting the controller 230 in or on the main board 200, driving of the inverter circuit 210 and the rectifier circuit 130 can be easily controlled.

Furthermore, as a result of using the above-described transformer board 100, the DC/DC converter 50 according to the present embodiment can be easily fabricated.

Second Embodiment

A DC/DC converter according to the present embodiment is different from the first embodiment in that a high-layer-count multilayer board including a large number of layers is used as a transformer board. Other than that, the configuration is similar to that of the first embodiment.

The number of layers included in the transformer board is, for example, twelve. In this transformer board, as in the first embodiment, the primary-side coil and the secondary-side coil of the transformer are alternately stacked so as to be integrated. In a case where the number of layers is twelve, three base members each being the one illustrated in FIG. 8A, three base members each being the one illustrated in FIG. 8B, three base members each being the one illustrated in FIG. 9A, and three base members each being the one illustrated in FIG. 9B are used for the transformer board.

Specifically, the primary-side coil is formed by using three base members each being the base member 102A having the coil-shaped conductive layer 112 formed on the surface thereof (see FIG. 8A), and three base members each being the base member 102B having the coil-shaped conductive layer 114 formed on the surface thereof (see FIG. 8B). The three base members 102A are disposed in a second layer, a fourth layer, and a sixth layer, respectively. The coil-shaped conductive layers 112 are connected in parallel to each other via the via 170 and the input-side terminal portion 150. Accordingly, the first-half portion of the primary-side coil is formed. Likewise, the three base members 102B are disposed in a seventh layer, a ninth layer, and an eleventh layer, respectively. The coil-shaped conductive layers 114 are connected in parallel to each other via the via 170 and the input-side terminal portion 152. Accordingly, the latter-half portion of the primary-side coil is formed. The first-half portion and the latter-half portion are connected in series via the via 170.

The secondary-side coil includes a first coil and a second coil. The first coil is formed by using three base members each being the base member 102C having the coil-shaped conductive layer 116 formed on the surface thereof (see FIG. 9A). The three base members 102C are disposed in a first layer, a third layer, and a fifth layer, respectively. The coil-shaped conductive layers 116 are connected in parallel to each other via vias 176 and 172. The base members 102C disposed inside (in the third layer and the fifth layer) need not necessarily have the conductive layer 180. Likewise, the second coil is formed by using three base members each being the base member 102D having the coil-shaped conductive layer 118 formed on the surface thereof (see FIG. 9B). The three base members 102D are disposed in an eighth layer, a tenth layer, and a twelfth layer, respectively. The coil-shaped conductive layers 118 are connected in parallel to each other via the vias 172 and 174. At least one of the three base members 102D may be provided with the wiring portion 118a.

In the present embodiment, a high-layer-count multilayer board is used as the transformer board, and a plurality of conductive layers constituting the primary-side coil of the transformer and a plurality of conductive layers constituting the secondary-side coil are alternately stacked. The cross flux between the primary-side coil and the secondary-side coil is further increased, and thus more favorable coupling between the primary-side coil and the secondary-side coil can be achieved. Accordingly, leakage of a magnetic flux can be effectively suppressed, and thus transmission efficiency can be easily increased and internal loss can be easily reduced.

The other advantageous effects are similar to those of the first embodiment.

Third Embodiment

Figure 15:
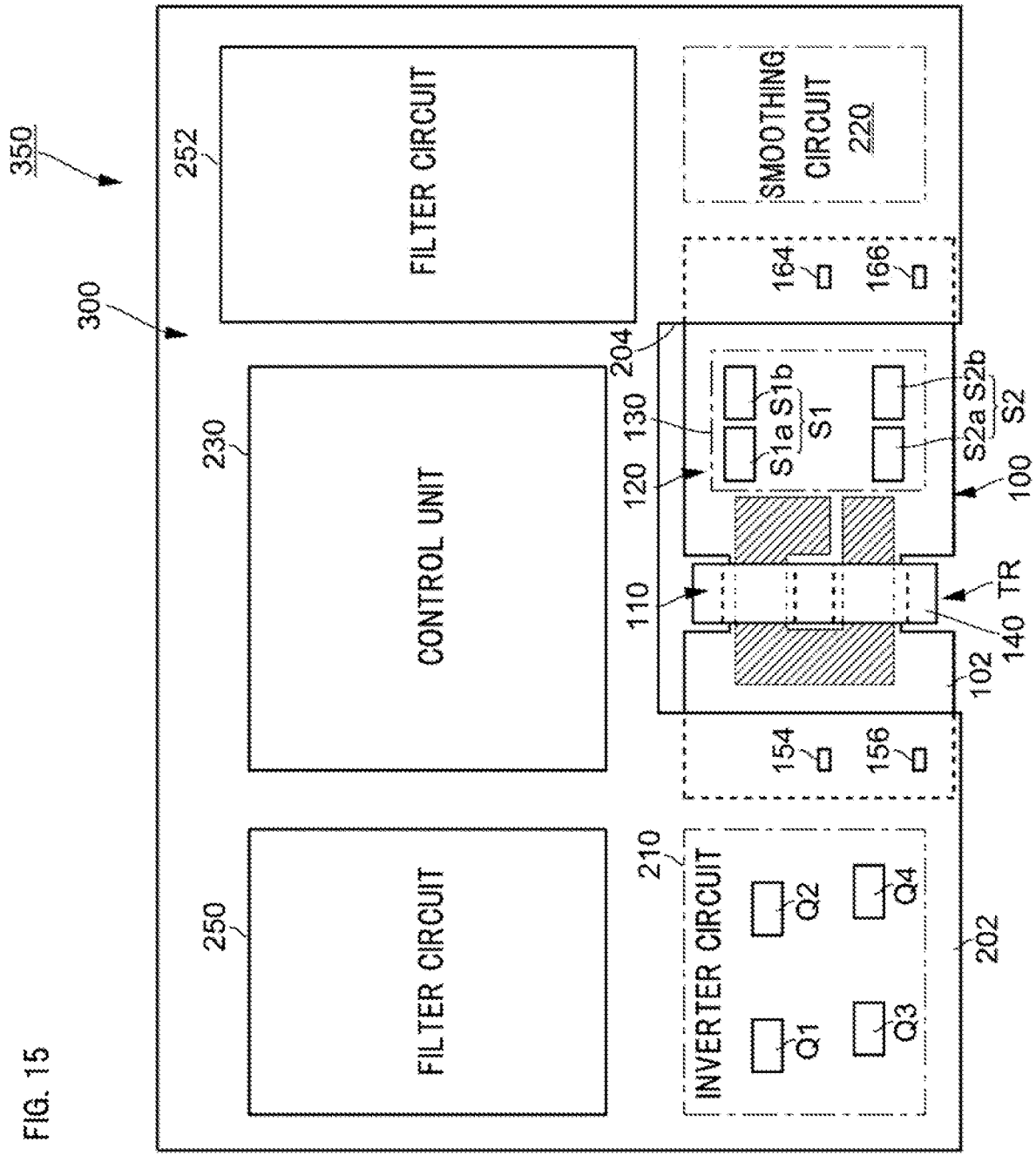
FIG. 15 is a plan view illustrating an overall configuration of a DC/DC converter according to a third embodiment.

Referring to FIG. 15, a DC/DC converter 350 according to the present embodiment is different from the first embodiment in including filter circuits 250 and 252. Other than that, the configuration is similar to that of the first embodiment.

The DC/DC converter 350 includes a main board 300 instead of the main board 200 (see FIG. 1). The filter circuits 250 and 252 are mounted on the main board 300. The main board 300 has a principal surface whose area is larger than the area of the principal surface of the transformer board 100. Thus, in a case where a DC/DC converter includes filter circuits, the filter circuits 250 and 252 can be easily mounted on the main board 300. Other than that, the configuration of the main board 300 is similar to that of the main board 200.

The other advantageous effects are similar to those of the first embodiment.

Fourth Embodiment

In the present embodiment, a description will be given of an example in which the step-down DC/DC converter 50 according to the first embodiment is mounted in a vehicle.

Figure 16:
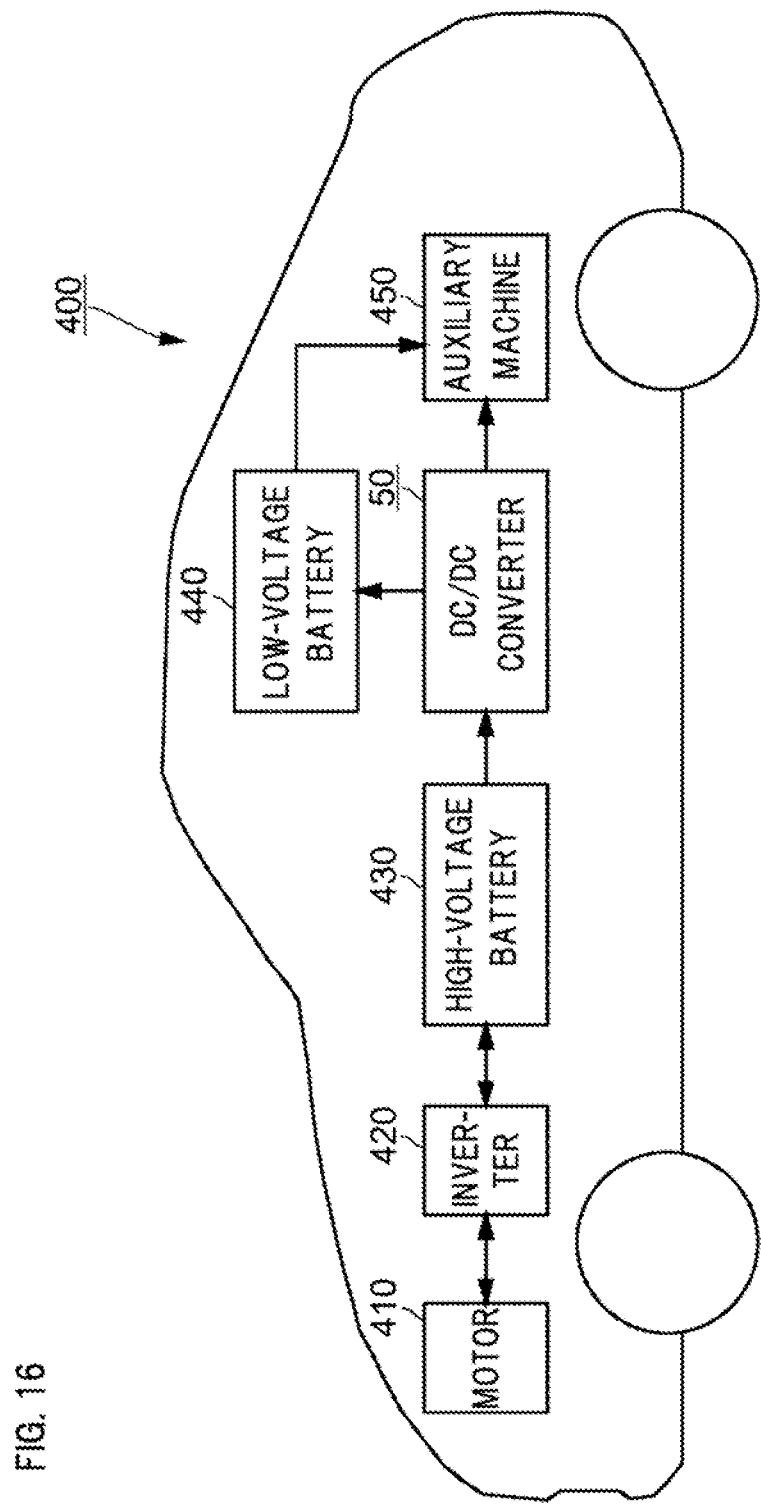
FIG. 16 is a diagram illustrating a schematic configuration of a vehicle according to a fourth embodiment.

Referring to FIG. 16, a vehicle 400 according to the present embodiment is an electric vehicle (EV), a hybrid electric vehicle (HEV), or a plug-in hybrid electric vehicle (PHEV). The vehicle 400 includes a main machine motor 410, an inverter 420, a high-voltage battery 430, a low-voltage battery 440, the DC/DC converter 50, and an auxiliary machine 450.

The main machine motor 410 is a motor for travelling and is driven by alternating-current power output from the inverter 420. The inverter 420 converts direct-current power of the high-voltage battery 430 into alternating-current power and supplies the alternating-current power to the main machine motor 410. The auxiliary machine 450 is an electronic device that is operated by direct-current power of the low-voltage battery 440 and includes, for example, a low-voltage load such as an electronic controller (ECU), a headlight, and an indoor light.

The high-voltage battery 430 is, for example, a high-voltage (for example, 300 V) power storage device constituted by connecting a plurality of lithium-ion batteries or the like. The low-voltage battery 440 is, for example, a low-voltage (for example, 12 V) power storage device, such as a lead battery.

In the present embodiment, the vehicle 400 has mounted therein the DC/DC converter 50 illustrated in the above first embodiment, and thus the power supplied from the high-voltage battery 430 can be efficiently converted by the DC/DC converter 50 and can be supplied to the low-voltage battery 440 or the auxiliary machine 450.

Alternatively, the DC/DC converter according to the second embodiment or the third embodiment, instead of the DC/DC converter 50 according to the first embodiment, may be mounted in the vehicle 400.

Modification Examples

The above embodiments illustrate an example in which the present disclosure is applied to a step-down DC/DC converter. However, the present disclosure is not limited to such embodiments. For example, the present disclosure may be applied to a step-up DC/DC converter. In this case, an inverter circuit, instead of a rectifier circuit, may be mounted in or on a transformer board.

The above embodiments illustrate an example in which an inverter circuit of a DC/DC converter is formed of a full-bridge circuit. However, the present disclosure is not limited to such embodiments. The inverter circuit may have another circuit configuration, for example, a half-bridge circuit or the like.

The above embodiments illustrate an example of using a transformer formed of three coils in total, including two coils on the secondary side. However, the present disclosure is not limited to such embodiments. The number of coils in the transformer may be two, or may be more than three. Alternatively, an auxiliary coil may be provided.

The above embodiments illustrate an example in which a primary-side coil and a secondary-side coil are alternately stacked in a transformer board. However, the present disclosure is not limited to such embodiments. The transformer board may have a configuration in which a primary-side coil and a secondary-side coil are not alternately stacked. In the case of alternately stacking a primary-side coil and a secondary-side coil, the alternate stacking may be performed in units of one layer as illustrated in the above embodiments, or in units of a plurality of layers (for example, in units of two layers).

The above embodiments illustrate an example of using a transformer board including four layers or twelve layers. However, the present disclosure is not limited to such embodiments. The number of layers of the transformer board may be the number other than the numbers illustrated in the above embodiments.

The above embodiments illustrate an example of using, as a base member of a transformer board, a base member having a conductive layer formed on one surface thereof. However, the present disclosure is not limited to such embodiments. For example, a base member having a conductive layer formed on each of both surfaces thereof may be used as a base member of the transformer board. The material of the base member may be an insulating material other than glass epoxy. In this case, it is preferable to use a material having an excellent heat dissipation characteristic.

The above embodiments illustrate an example in which a rectifier circuit is a push-pull circuit. However, the present disclosure is not limited to such embodiments. The rectifier circuit may have a circuit configuration other than that of a push-pull circuit.

The above embodiments illustrate an example in which a rectifier circuit is formed in or on a transformer board. However, the present disclosure is not limited to such embodiments. The circuit formed in or on the transformer board may be a circuit other than a rectifier circuit. For example, another AC/DC conversion unit may be provided in or on the transformer board.

The above embodiments illustrate an example in which a controller is formed in or on a main board. However, the present disclosure is not limited to such embodiments. For example, the controller may be mounted in or on a board or the like other than the main board. The above embodiments further illustrate an example in which filter circuits are mounted on a main board. However, the present disclosure is not limited to such embodiments. For example, a circuit, a component, or the like other than the filter circuits may be mounted in or on the main board instead of or in addition to the filter circuits.

The above embodiments illustrate an example of a DC/DC converter including one circuit board (main board). However, the present disclosure is not limited to such embodiments. The DC/DC converter may have a configuration including a plurality of circuit boards.

The above embodiments illustrate an example in which a main board has a notch portion that is provided at a portion where a transformer board is disposed. However, the present disclosure is not limited to such embodiments. The main board need not necessarily have a notch portion. The method for attaching the transformer board to the main board may be a method other than the method illustrated in the above embodiments. It is sufficient that the transformer board be electrically connected to the main board. From this point of view, the transformer board may be attached to a member other than the main board.

The above embodiments illustrate an example in which an EI-shaped core is used as a core member of a transformer. However, the present disclosure is not limited to such embodiments. The core member may have another shape, for example, an EE shape, an EF shape, an ER shape, a PQ shape, or the like.

An embodiment obtained by appropriately combining the techniques disclosed above is also included in the technical scope of the present disclosure.

The embodiments disclosed herein are merely examples, and the present disclosure is not limited to only the above embodiments. The scope of the present disclosure is indicated by each of the claims in view of the detailed description of the invention, and includes all changes within the meaning and scope equivalent to the wording used in the claims.

REFERENCE SIGNS LSIT 30 circuit
32, 210 inverter circuit
34, TR transformer
36, 130 rectifier circuit
38, 220 smoothing circuit
50, 350 DC/DC converter
50A primary-side portion
50B secondary-side portion
60 primary-side coil
62 secondary-side coil
62*a* first coil
62*b* second coil
100 transformer board, multilayer board
102, 202 printed wiring board
102A to 102D base member
102*a* through-hole
102*b*, 102*c*, 204 notch portion
110 transformer region
112, 114, 116, 118, 180, 182 conductive layer
118*a*, 180*a* wiring portion
120 circuit formed region
140 core member
142 E-shaped core
142*a* center magnetic leg
142*b*, 142*c* side magnetic leg
144 I-shaped core
150, 152, 160, 162 terminal portion
154, 156, 164, 166 terminal pin
170, 172, 174, 176 via
200, 300 main board, circuit board
230 controller
240, 242 input terminal 244, 246 output terminal
250, 252 filter circuit
400 vehicle
410 main machine motor
420 inverter
430 high-voltage battery
440 low-voltage battery
450 auxiliary machine
Q1 to Q4, S1 to S2 switch element

The invention claimed is:

1. A power conversion device comprising:
a multilayer board including conductive layers that form a primary-side coil and a secondary-side coil of a transformer;
a circuit board electrically connected to the multilayer board, the circuit board having a first conversion circuit formed therein or thereon; and
a rectangular-shaped notch portion formed on one side of the circuit board,
wherein the multilayer board includes
  a transformer region in which the transformer is formed,
  a core member which is disposed in the transformer region and around which the primary-side coil and the secondary-side coil are wound,
  a circuit formed region which is adjacent to the transformer region and in which a second conversion circuit is formed, the second conversion circuit being electrically connected to one coil of the primary-side coil and the secondary-side coil,
  a first terminal portion which is electrically connected to the other coil of the primary-side coil and the secondary-side coil, and
  a second terminal portion which is electrically connected to the second conversion circuit,
wherein the multilayer board is disposed in the notch portion such that a part of the multilayer board overlaps the circuit board,
wherein the first conversion circuit is electrically connected to the transformer via the first terminal portion,
wherein the second conversion circuit is electrically connected to the circuit board via the second terminal portion, and
wherein the one coil connected to the second conversion circuit has a smaller number of turns than the other coil connected to the first terminal portion.

2. The power conversion device according to claim 1, wherein the circuit board has a smaller number of layers than the multilayer board.

3. The power conversion device according to claim 1, wherein the circuit board has a principal surface whose area is larger than an area of a principal surface of the multilayer board.

4. The power conversion device according to claim 1, wherein in the transformer region of the multilayer board, conductive layers constituting the primary-side coil and conductive layers constituting the secondary-side coil are alternately stacked.

5. The power conversion device according to claim 1,
wherein the first conversion circuit includes a first switch circuit that converts a direct-current voltage into an alternating-current voltage, and
wherein the second conversion circuit includes a second switch circuit that rectifies the alternating-current voltage obtained through conversion by the first switch circuit.

6. The power conversion device according to claim 1, wherein the circuit formed region is provided in a region opposite the first terminal portion with the transformer region interposed therebetween.

7. The power conversion device according to claim 1, wherein the circuit board includes a controller that controls driving of at least one of the first conversion circuit and the second conversion circuit.

* * * * *